United States Patent [19]
Yoon et al.

[11] Patent Number: 5,338,630
[45] Date of Patent: Aug. 16, 1994

[54] PHOTOLITHOGRAPHY CONTROL SYSTEM AND METHOD USING LATENT IMAGE MEASUREMENTS

[75] Inventors: Euisik Yoon, Sunnyvale; Robert W. Allison, Jr., San Jose; Ronald P. Kovacs, Mountain View, all of Calif.

[73] Assignee: National Semiconductor Corporation, Santa Clara, Calif.

[21] Appl. No.: 154,603

[22] Filed: Nov. 18, 1993

Related U.S. Application Data

[62] Division of Ser. No. 846,590, Mar. 5, 1992, Pat. No. 5,283,141.

[51] Int. Cl.$^5$ .............. G03C 5/00; H01L 21/00; G01R 31/26
[52] U.S. Cl. .............. 430/30; 250/492.1; 250/492.2; 430/311; 437/7; 437/8
[58] Field of Search .............. 430/30, 311; 437/7, 437/8; 250/492.1, 492.2

[56] References Cited

U.S. PATENT DOCUMENTS

| | | | |
|---|---|---|---|
| 4,364,633 | 12/1982 | Verber et al. | 385/3 |
| 4,811,055 | 3/1989 | Hirose | 355/53 |
| 4,929,083 | 5/1990 | Brunner | 356/400 |
| 5,077,085 | 12/1991 | Schnur et al. | 427/98 |
| 5,079,600 | 1/1992 | Schnur et al. | 427/98 |

OTHER PUBLICATIONS

K. C. Hickmn; "Use Of Diffracted Light From Latent Images To Improve Lithography Control"; SPIE Microlithography Conference; 1464-22, Mar. 5, 1991.

Thomas E. Adams; "Applications of Latent Image Metrology In Microlithography"; SPIE Microlithography Conference; 1464-26; Mar. 5, 1991.

Karl W. Edmark et al.; "Stepper Overlay Calibration Using Alignment To A Latent Image"; SPIE vol. 538; Optical Microlithography IV; pp. 91-101 (1985).

*Primary Examiner*—John Kight, III
*Assistant Examiner*—Terressa Mosley
*Attorney, Agent, or Firm*—Flehr, Hohbach, Test, Albritton & Herbert

[57] ABSTRACT

A method of and apparatus for processing semiconductor wafers which include observing optical characteristics of exposed undeveloped photoresist, without removing the wafers from the stepper is disclosed. The present invention includes the steps of loading a wafer having a layer of photoresist into a photolithography system, exposing the photoresist in accordance with an initial set of control parameters including exposure time, position of the wafer within the photolithography system, and/or focus change. Prior to developing the photoresist, optical characteristics of the exposed photoresist are observed using a phase contrast microscope which detects latent images. Then, according to the observations of the latent image, the initial set of control parameters are adjusted to generate a second set of control parameters.

7 Claims, 5 Drawing Sheets

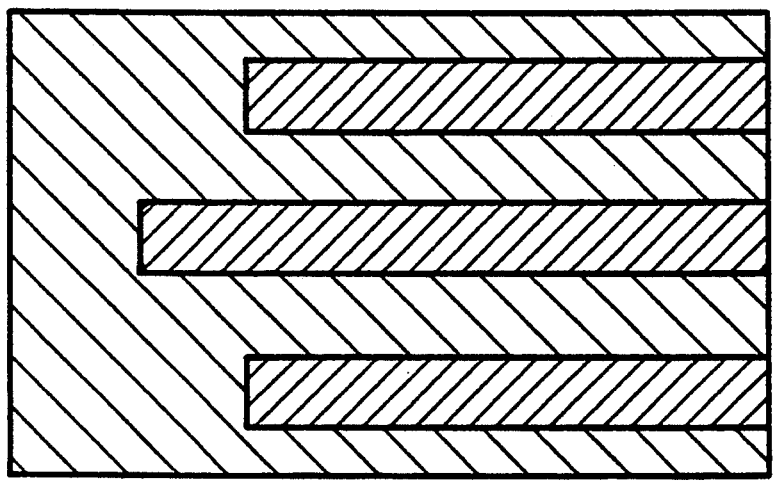
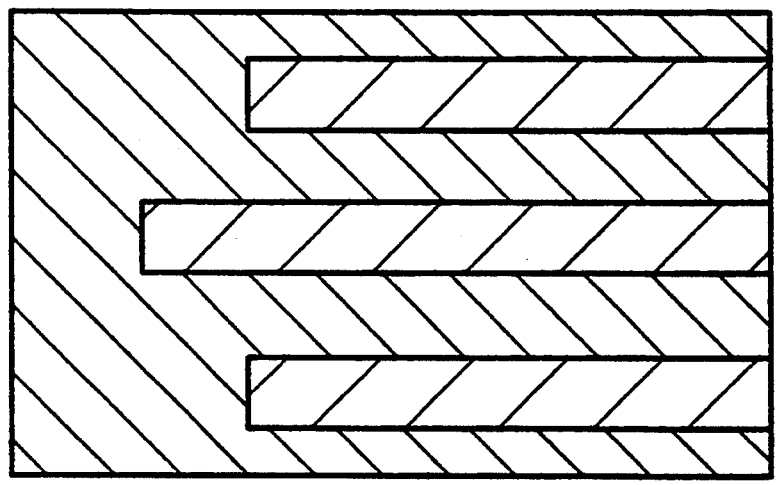
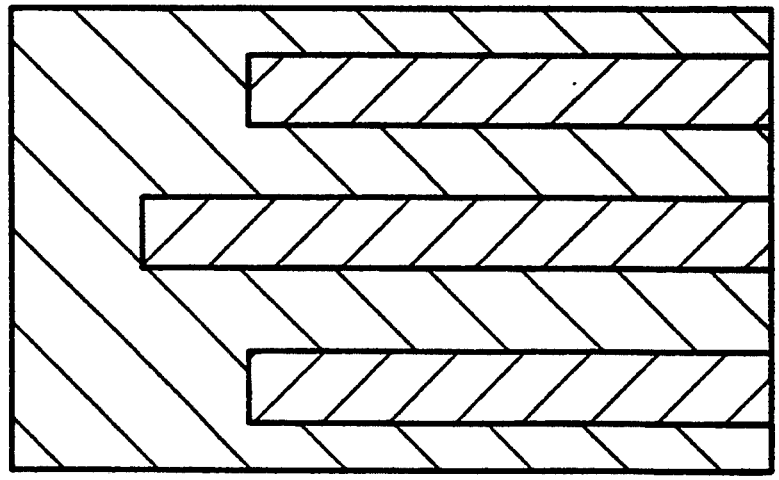
LATENT IMAGES ON KTI 825 BY I-LINE STEPPER
FIG. 2a BRIGHT FIELD
FIG. 2b DARK FIELD
FIG. 2c PHASE CONTRAST

NORMALIZED IMAGE CONTRAST VS DEFOCUS AS A FUNCTION OF LINEWIDTH

MEASURED IMAGE CONTRAST VS EXPOSURE ENERGY AS A FUNCTION OF LINEWIDTH

PHOTOLITHOGRAPHY CONTROL SYSTEM AND METHOD USING LATENT IMAGE MEASUREMENTS

This application is a divisional continuation of application Ser. No. 07/846,590, filed Mar. 5, 1992, now U.S. Pat. No. 5,283,141.

FIELD OF THE INVENTION

The present invention relates to processing semiconductor wafers. More specifically, it relates to a method for adjusting the control parameters of a photolithography system.

BACKGROUND OF THE INVENTION

In the manufacture of integrated circuits a frequently-used sequence of processing steps is as follows: depositing (or growing) a dielectric (or metal/polysilicon) layer on a wafer; coating a thin film of photoresist; projecting a mask pattern onto the photoresist multiple times using a stepper (photolithography system); and then developing the exposed photoresist to create a selective pattern of exposed and unexposed regions. Then the masked layer (dielectric, metal, or polysilicon) is etched or exposed to dopants, or both.

This process is repeated many times successively on the wafers under process until a complete circuit is formed. Because overlay tolerances for advanced circuit designs are on the order of ±0.25 μm over 100 to 150 mm diameter wafers, element-by-element accuracy is crucial. In view of the required precision, and the length and complexity of the manufacturing cycle, accurate and rapid overlay calibration of the stepper's exposure control mechanism (e.g. exposure energy and focus) is critical to the productivity of the manufacturing line. Furthermore, as the microelectronics industry strives to achieve smaller device design geometries, control of linewidth or critical dimensions, has become increasingly important.

Each time a layer is set up for processing by a photolithography system, the control parameters of the photolithography system must be adjusted for a varieties of material and thickness variations in order to produce patterns within required tolerances. Control parameters include exposure energy and focus, and sometimes numerical aperture, partial coherence, and overlay distortion. Adjustment of the control parameters during the processing of semiconductor wafers requires inspection of mask patterns in photoresist to provide information for the manipulation of the control parameters of the photolithography system.

Typically, measurement and reference strategies include combinations and permutations of off-line inspection methods using optical verniers, electrical test structures, and online metrology using the local alignment and stage positioning capabilities of the system under test. These methods are slow and tedious and require lengthy interruptions in the use of very expensive stepper systems.

Accordingly, there is a need for a rapid and reproducible photolithography control method. Specifically, eliminating the need to remove the wafer from the photolithography system for inspection during its processing, particularly after exposure and before development, would increase production efficiency. However, prior to developing the photoresist, the photochemical changes caused by exposure are not visible using conventional bright field microscopy. Therefore, there is a need for an inspection system which provides images of the pattern of exposed undeveloped photoresist.

OBJECTS AND SUMMARY OF THE INVENTION

It is therefore a general object of the present invention to provide rapid and reproducible photolithography control method.

It is another object of the present invention to provide a method for processing semiconductor chips which uses a phase contrast microscope for measuring latent image in exposed undeveloped photoresist.

It is a further object to provide a rapid and reproducible semiconductor chip processing method which includes adjustment of the exposure time for the photoresist layer on the wafer.

It is also an object of the present invention to provide a rapid and reproducible processing method which includes the adjustment of other photoresist exposure parameters including focus, illumination coherence, and overlay alignment.

The foregoing and other objects of the invention are achieved by a method of and apparatus for processing semiconductor wafers which include observing optical characteristics of exposed undeveloped photoresist without removing the wafers from the stepper. The present invention includes the steps of loading a wafer having a layer of photoresist into a photolithography system, exposing the photoresist in accordance with an initial set of control parameters including exposure time (providing exposure energies), position of the wafer within the photolithography system and focus. Prior to developing the photoresist, optical characteristics of the exposed photoresist are observed by the phase contrast microscope which detects latent images. Then, according to the observations of the latent image, the initial set of control parameters are adjusted to generate a second set of control parameters.

BRIEF DESCRIPTION OF THE DRAWINGS

Other objects, and many of the intended advantages of the present invention, will be readily appreciated as the same becomes better understood by reference to the following detailed description when considered in connection with the accompanying drawings wherein:

FIGS. 2a–2c are latent images observed from a phase contrast microscope in three different modes, including phase contrast mode.

DETAILED DESCRIPTION OF THE INVENTION

Figure 1:
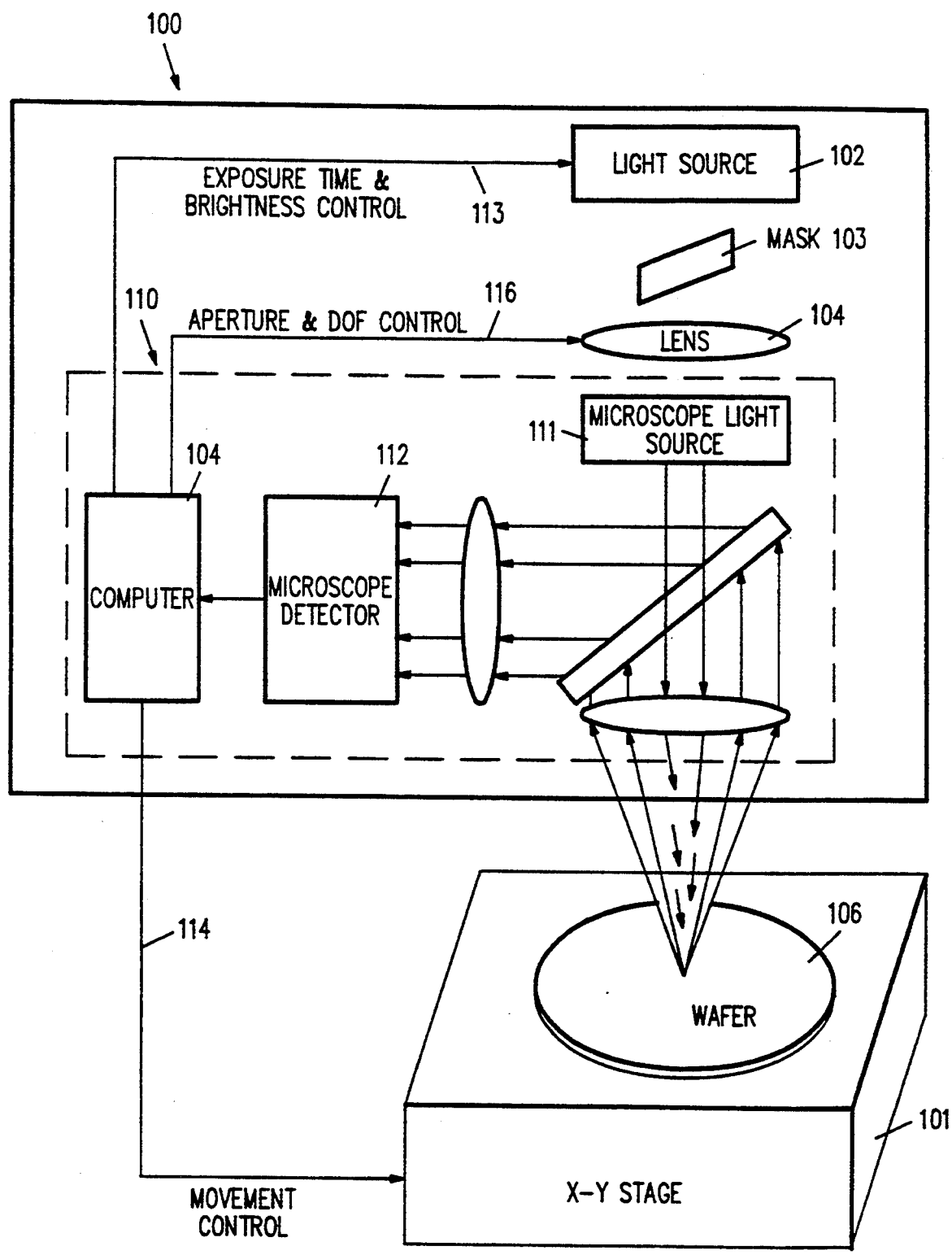
FIG. 1 is a schematic drawing of a photolithography system including the adjustment means used of the present invention.

Attention is drawn to FIG. 1 which is a schematic drawing of a photolithography system 100 including the observation means 110, a phase contrast microscope, of the present invention. The system 100 has a set of adjustable control parameters that are typically adjusted each time a new batch of semiconductor wafers is set up for processing. The system 100 includes positioning means 101, which is an x-y stage, for positioning wafers for exposure. The system 100 also includes exposing means, light source 102, for exposing the photoresist to light. Moreover, system 100 includes the phase contrast microscope 110 positioned to observe latent images from the wafer after the photoresist layer is exposed to light. Adjustment means, such as a computer 104, adjusts the control parameters according to information obtained from the observations of latent images by the phase contrast microscope 110.

A latent image is made directly observable to an operator or data collecting system by the phase contrast microscope of the present invention. FIG. 2 shows three different types of images which are observable. FIG. 2(a) shows a phase contrast latent image. FIG. 2(b) shows a dark field image and FIG. 2(c) shows a bright field image, which are the images acquired in conventional microscopy. The phase contrast image of FIG. 2(a) is the most observable latent image of the three shown in FIG. 2.

The principles of the phase contrast microscope 110 are described in detail by Bennett, A. et al, *Phase Microscopy* (1951) John Wiley. The phase contrast microscope used in the preferred embodiment is obtainable from RA Services, located at 6249 Shadelands Drive, San Jose, Calif. 95123.

The following is a brief description of the principles by which a latent image is observable in exposed resist. After a thin layer of photoresist on a semiconductor wafer has been exposed and a mask pattern is printed thereon, the exposed portions of the photoresist undergo a photochemical change which changes the dielectric constant (or the refractive index) of the photoresist. A change in the dielectric constant results in a change in the photoresist's "optical thickness," and the optical thickness of the photoresist is dependent on the length and intensity of its exposure. The exposure induced change in the optical thickness will yield a relative phase shift between light which traverses the exposed versus the unexposed regions. Light reflected from the wafer to the detector 112 carries with it the phase shift information.

The gradient of the phase at the boundary of a latent image feature will be determined by how sharply and how strongly the feature is printed. The larger, more abrupt the change in phase the more intense the resulting observable latent image. The phase contrast microscope converts phase differences in reflected light into contrast differences in a digitized image that represents the pattern printed on the photoresist. The observed latent image will correspond to the actual mask pattern produced in the resist by the exposing step.

The present method and apparatus is based on the empirical observation that when photoresist undergoes a normal exposure to a mask pattern, the optical thickness in the exposed region is modified and measurable. Linewidth measurements can be made by measuring the width of exposed and un-exposed photoresist regions.

All of the characteristics which govern the exposure tool's capability to form a mask pattern on a photoresist layer of a wafer contribute to the latent image produced in the resist. By using information from a number of exposures taken under purposely varied conditions, the contributions of individual system's characteristics may be identified and measured.

Figure 3:
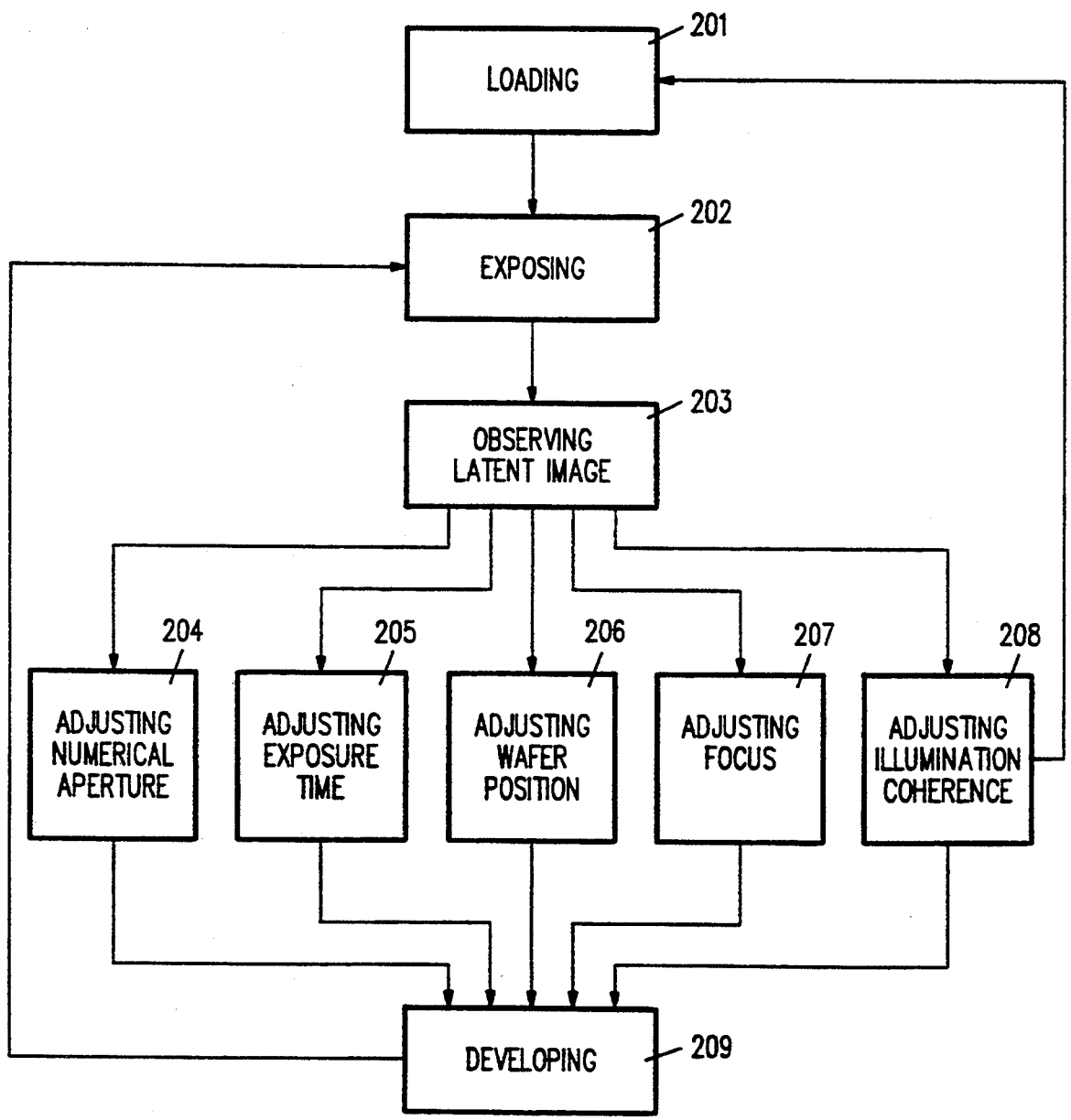
FIG. 3 is a flow chart diagram of the method of the present invention.

Referring to FIG. 3, the latent imaging metrology process begins by loading a resist coated wafer into the photolithography system 100 (step 201). During exposure step 202, light source 102 illuminates light which passes through mask 103 and lens 104 onto the wafer 106. Typically, multiple die on the wafer are individually exposed in a step and repeat process. After exposure, latent image measurements (step 203) are preferably performed directly within the photolithography system 100.

The microscope system 110 in the preferred embodiment is positionable over the wafer within the photolithography apparatus, so that the wafer remains positioned where the exposure took place. For example, the microscope system 110 is mounted on a swivel or on a track (not shown) so that the microscope system 110 can be easily moved in and out of position. In an alternative embodiment, the microscope system 110 monitors the mask pattern in the resist as the exposure is actually taking place, providing in-situ monitoring of the exposure process.

In another alternative embodiment, the wafers are removed from the stepper after exposure for the observing step. After the observing step is completed, the wafers are returned to the stepper.

The measurement optics and a light beam generated by the microscope's light source 111 are used to probe the wafers' exposed features in the observation step 203. This microscope's light source is a unartinic wavelength of the photoresist so that there is actually no illumination damage caused by this light to the photoresist under observation. The direct reflected light is returned to the source 111, while a section of the scattered probe beam is diverted through appropriate optics and filters to the detector 112. The signal from the detector 112 is digitized by a computer (such as a personal computer) based A/D converter (not shown) and stored in the memory for further image processing and display.

In a first embodiment, the method of processing the semiconductor wafer comprises setting up a matrix of latent images, wherein each element of the matrix results from the control parameters being sequentially and incrementally varied while others are held constant. When the matrix is completed, the observed images are compared quantitatively. The operator or data collecting system then chooses the setting of the control parameters which produced the observed latent image depicting the best linewidth characteristics.

To produce the matrix, the control parameters of the photolithography system 100 are set to an initial setting and their settings are recorded. As noted above, the control parameters include exposure time, focus, and the wafer position with respect to the x-y stage. Depending on the stepper capability, the control parameters can also include numerical aperture, illumination coherence, etc.

Figure 4:
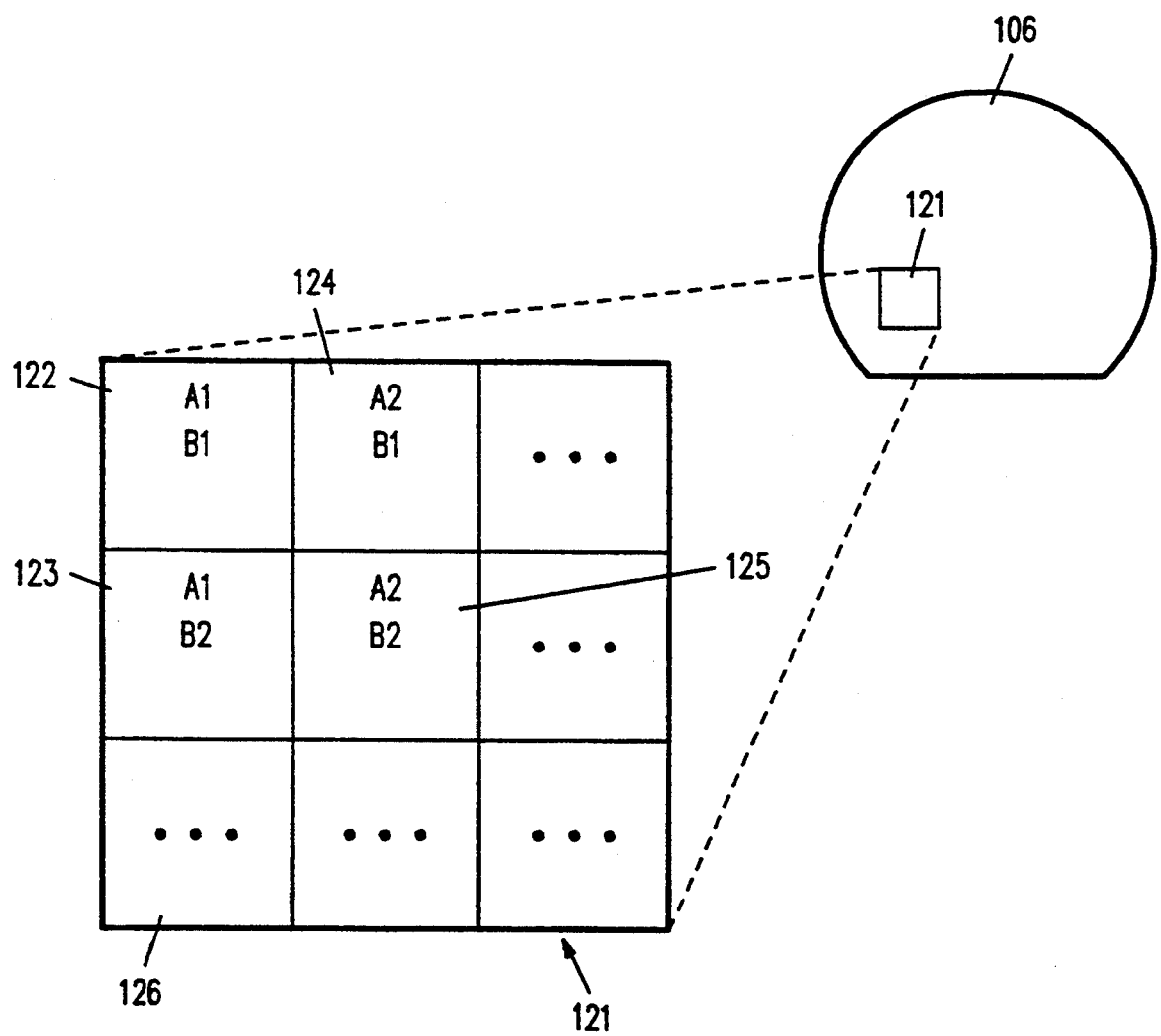
FIG. 4 is a schematic diagram of a matrix of exposed die corresponding to the first embodiment of the present invention.

FIG. 4 is a schematic diagram of a matrix 121 of exposed die which is a portion of wafer 106 under processing. Matrix 121 is used as a test region for the purpose of calibrating the stepper in accordance with the present invention. FIG. 4 illustrates two of the three control parameters being incrementally varied as the stepper exposes die positions on the wafer.

The choice of which control parameters are varied and which remain fixed may differ depending on the photolithography system in use and the number of control parameters of the system in use. The wafer position parameter remains fixed throughout the generation of the matrix because the effects of the wafer position can be measured by analyzing the matrix as a whole. Because the wafer position is a function of the step size of the stepper, the wafer position is measured by checking the registration marker position of the exposed die and determining if there is an increasing error in the x or y direction over the entire matrix 121.

In FIG. 4, the matrix 121 is composed of matrix elements, 122, 123, 124 and 125. Notationally, exposure time is denoted as A, and defocus is noted as B. In the upper left hand corner of the matrix 122, each control parameter is at its initial setting, therefore, the control parameters are denoted, A1 and B1. Matrix element 126 is representative of the continuation of the permutations sequentially made from matrix element 122 to matrix element 125.

For each element of the matrix, one control parameter is incrementally varied. For example, the matrix element 123 which is directly below element 122, focus has been varied and is denoted B2. The other control parameter remains fixed at its initial value. Moreover, in the matrix element 124, the exposure duration has been varied and is denoted A2. Furthermore, in the matrix element numbered 125, both the exposure duration and focus have been varied from their initial setting, denoted by A2 and B2. Ultimately, a matrix of 36 exposed dies is generated, each having a different setting combination of these two parameters.

A second matrix of latent images may then be formed varying the other control parameters, numerical aperture and illumination coherence, while holding exposure duration and defocus fixed. In this manner, arrays of latent images are generated using selected combinations of control parameter values.

For each die exposed using a distinct control parameter setting, the phase contrast microscope 110 provides a observable latent image, either to an operator or a data collecting system. When the matrix is completed, the observed images are compared with predefined criteria for sufficiency of photoresist exposure according to intensity of the latent image, linewidth, spacewidth and sharp gradients between exposed and unexposed regions.

The operator or data collecting system then chooses the setting of the control parameters which produced the observed latent image depicting the best linewidth characteristics. The initial set of control parameters are then adjusted to generate a second set of control parameters. The adjusting step is depicted in FIG. 3, as adjusting numerical aperture 204, exposure time 205, adjusting x-y die to die step size of the stepper apparatus which affects the wafer position 206, adjusting focus 207 and adjusting illumination coherence 208.

Returning to FIG. 1, adjustment means for changing exposure time and illumination coherence is represented by control arrow 113. Moreover, adjustment means for changing the wafer position is represented by control arrow 114. Furthermore, adjustment means for changing the focus and the numerical aperture by control arrow 116.

After the second set of control parameters is established, the photolithography system proceeds to expose the photoresist on a run of wafers. Those wafers are subsequently developed. Periodically, exposure processing will be interrupted to observe a latent image, and make adjustments of the control parameters if necessary.

In another embodiment, the computer 104 is programmed to receive signals from detector 112 and to analyze the same. The digitized signal is recorded by computer 104. This data, combined with feature and exposure condition information, is written into a measurement database. The computer 112 then analyzes the signals according to predetermined theoretical models. The image data from the microscope 110 is typically converted to control parameter adjustment values using a nonlinear function to obtain measurement values corresponding to the dielectric constants of the photoresist. These calculations provide the values of the control parameters' adjustments and any other variable which could affect the exposure of a mask pattern such as temperature or barometric pressure of lens 104 and the optical illumination media. The initial set of control parameters are then adjusted to generate a second set of control parameters in steps 204–208 of FIG. 3.

While it is preferable to utilize computer 104 as the adjustment means, manual adjustments to the photolithography system's control parameters can also be made by analyzing the properties of the system based upon a visual inspection of the latent images made observable by the phase contrast microscope 110.

Figure 5:
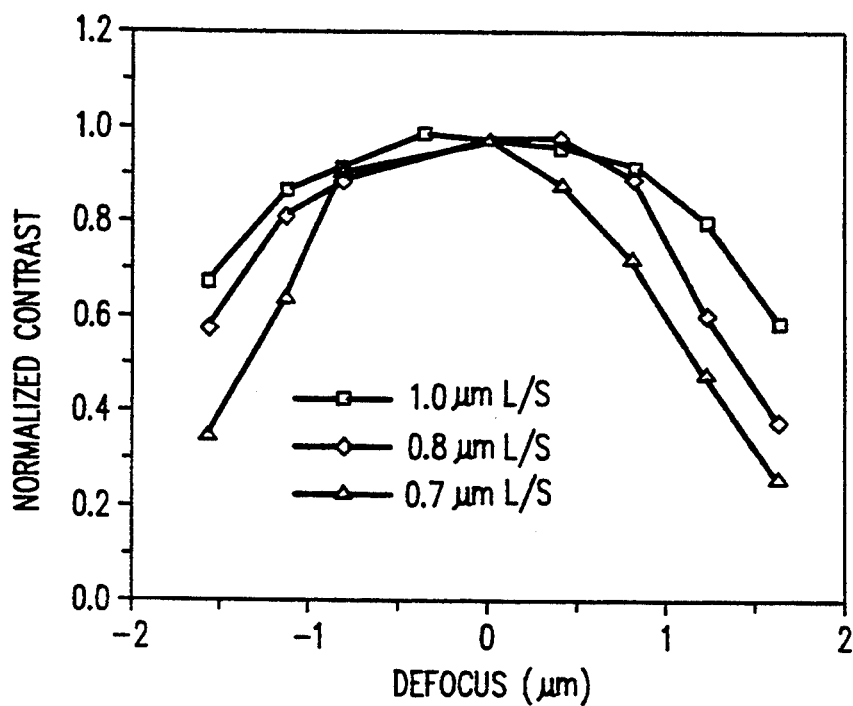
FIG. 5 shows a set of normalized contrast data points for measurements made with varying focus.

FIG. 5 shows normalized contrast measured on the latent image as a function of defocus for three different linewidth and spacewidth dimensions. From FIG. 5, it is observed that the larger the linewidth and spacewidth, the wider the defocus range. For each linewidth and space width, an optimum contrast value is normalized to 1.0. According to this observation, adjustment of the focus is made.

Figure 6:
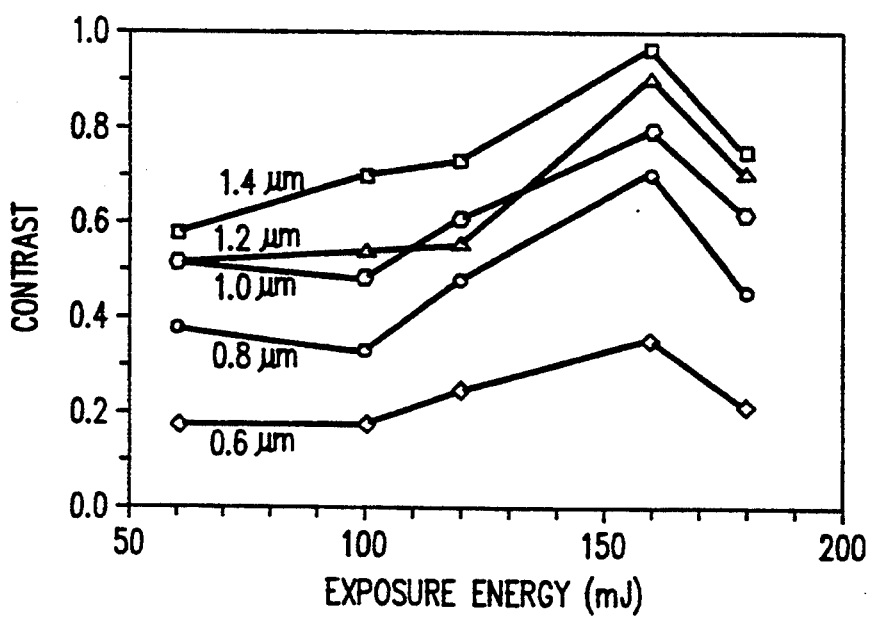
FIG. 6 shows a set of normalized contrast data points for measurements made with varying exposure energies at a fixed focus.

FIG. 6 shows normalized contrast measured on the latent image as a function of exposure energy (controlled by exposure time) for five different linewidth and spacewidth dimensions. From FIG. 6, it is observed that the maximum contrast was measured at the exposure energy of 160 mJ for all the linewidth and spacewidth patterns with pitches from 0.6 to 1.4 $\mu$m. According to this observation, adjustment of the exposure energy to 160 mJ, provides an optimum exposure time.

Returning to FIG. 3, once the adjustment step 204–207 is completed, a batch of wafers is exposed and the development step 209 then takes place. This process continues until an observing step 203 is called for, which is typically at predetermined intervals.

In summary, the present invention utilizes latent image metrology, which is based on the phase shift observation from exposed undeveloped features of photoresist on a wafer. Interrogation of the phase modulation produced in a layer of exposed photoresist provides the quantitative determination of a number of exposure tool characteristics. Most importantly, these characteristics are measured quickly, without having to develop the exposed photoresist, allowing quick adjustment of the stepper apparatus for each new mask layer or each new batch of wafers.

While the present invention has been shown and described in what is presently conceived to be the most practical and preferred embodiment of the invention, it will become apparent to those of ordinary skill in the art that many modifications thereof may be made within the scope of the invention, which scope is to be accorded the broadest interpretation of the claims so as to encompass all equivalent structures.

We claim:

1. A photolithography system for processing at least one semiconductor wafer having a photoresist layer thereon, said system having a set of control parameters, said system comprising:

positioning means for positioning said wafers within said system;

exposing means for exposing said photoresist to light and printing at least one mask pattern on said photoresist;

a phase contrast microscope positioned to measure linewidth characteristics of latent images of said at least one mask pattern on said photoresist of said wafer prior to developing said photoresist; and adjustment means for adjusting said control parameters according to said measured linewidth characteristics of said latent images.

2. A system as recited in claim 1 further comprising development means for developing said photoresist layer.

3. A system as recited in claim 1 wherein said initial set of control parameters includes exposure time and wherein said adjusting means changes said exposure time.

4. A system as recited in claim 1 wherein said initial set of control parameters includes the position of said wafer within said photolithography system and wherein said adjusting means changes said position of said wafer.

5. A method as recited in claim 1 wherein said initial set of control parameters includes the defocus of said photolithography system and wherein said adjusting means changes said defocus of said photolithography system.

6. A method as recited in claim 1 wherein said initial set of control parameters includes the numerical aperture of said photolithography system and wherein said adjusting means changes said numerical aperture of said photolithography system.

7. A method as recited in claim 1 wherein said initial set of control parameters includes the illumination coherence of said photolithography system and wherein said adjusting means changes said illumination coherence of said photolithography system.

* * * * *